United States Patent
Bateman et al.

[19]

[11] Patent Number: 5,939,951
[45] Date of Patent: Aug. 17, 1999

[54] METHODS AND APPARATUS FOR MODULATING, DEMODULATING AND AMPLIFYING

[75] Inventors: Andrew Bateman, Bath, United Kingdom; Kam Yuen Chan, Chai Wan, The Hong Kong Special Administrative Region of the People's Republic of China

[73] Assignee: BTG International Limited, London, United Kingdom

[21] Appl. No.: 08/976,950

[22] Filed: Nov. 24, 1997

Related U.S. Application Data

[63] Continuation of application No. PCT/GB96/01259, May 28, 1996.

[30] Foreign Application Priority Data

May 25, 1995 [GB] United Kingdom .................. 9510679

[51] Int. Cl.[6] .......................... H04L 27/36; H04L 27/38; H03F 1/32; H03L 7/07
[52] U.S. Cl. ........................... 332/103; 330/10; 330/103; 329/308; 329/325; 331/2; 332/127
[58] Field of Search ................. 331/2; 329/325, 329/326, 346, 360, 308; 330/10, 103; 332/127, 128, 144, 162, 103

[56] References Cited

U.S. PATENT DOCUMENTS

| | | | |
|---|---|---|---|
| 5,105,168 | 4/1992 | DaSilva | 331/2 |
| 5,381,108 | 1/1995 | Whitmarsh et al. | 330/2 |
| 5,469,105 | 11/1995 | Sparks | 330/129 |

FOREIGN PATENT DOCUMENTS

WO 93/23921  11/1993  WIPO.

*Primary Examiner*—Siegfried H. Grimm
*Attorney, Agent, or Firm*—Pillsbury Madison & Sutro LLP

[57] ABSTRACT

An apparatus is disclosed for processing an input signal. The apparatus includes two feedback loops for generating output signal components from the input signal. Each loop contains an oscillator, which has a frequency or phase which is variable in response to a control signal, and a comparator for generating the control signal. The oscillator generates a loop output signal which forms one of the components of the output signal. The apparatus also includes a combiner for combining the loop output signals to produce the output signal. For each loop, the apparatus also produces a feedback loop operating signal, these signals being dependent on the output signal and in phase quadrature with one another. One input of the comparator in each loop receives the feedback loop operating signal, and the other input of the comparator receives a component of the input signal. The apparatus also continuously ensures that the output signal is stable whatever the phase of the output signal relative to that of the input signal.

31 Claims, 5 Drawing Sheets

METHODS AND APPARATUS FOR MODULATING, DEMODULATING AND AMPLIFYING

This is a Continuation of International Appln. No. PCT/GB96/01259 filed May 28, 1996 which designated the U.S.

The present invention relates to methods and apparatus for processing an input signal (particularly QPSK and π/4 QPSK signals), or components thereof, to provide highly efficient linear amplification, modulation and demodulation.

A LINC amplifier has been proposed (see D. C. Cox, "Linear Amplification Using Non-Linear Components", IEEE Transactions on Communications, Vol. COM-22, 1974, pages 1942 to 1945) in which a modulating signal is split into two phase modulated components with constant envelopes which can be amplified separately using highly non-linear but power efficient amplifiers. Combining the two output signals yields the desired linearly amplified signal. With a LINC amplifier the potential for dc to RF conversion efficiency can approach 100%, assuming ideal matching amplifiers. However, in practical LINC amplifiers, the suppression of broadband phase modulation relies on a very tight tolerance on the gain and phase match between the two paths. A gain error of 0.01 dB and a phase error of 0.1° give a component suppression of only 54 dB. Such a tolerance is impossible to achieve in a open loop system where much greater gain and phase variations can occur with changes in operating frequency, output power and temperature, and the ageing of components.

International Application No. WO 93/23921-A, the entire contents of which is incorporated herein by reference, has the same overall objectives as the present invention. The arrangements described in the above application are complicated by stability problems leading to switching complexity from certain phases of input signals. Also some of these circuits suffer to some extent from noise problems when the envelope of an applied input signal such as a QPSK or a π/4 QPSK signal goes through zero. The phase locked loops, containing the Voltage Controlled Oscillators (VCOs), of these circuits are stable only when the input signals are in a certain phase range. The switching arrangement attempts to switch the input signal into stable region of operation. The disadvantage of the above arrangements are that the switching is only triggered when the input signal crosses from the stable quadrant into an unstable quadrant. This results in noise being generated when the switching occurs, and the input and output vectors may be out of lock because the VCOs cannot respond with sufficient speed.

U.S. Pat. No. 5,105,168 describes a vector locked loop (VLL) which suffers from an input amplitude response which rises with the input signal amplitude. The Voltage Controlled Oscillators (VCO) have an output frequency that is very sensitive to noise and temperature. In the configuration shown in FIG. 8, in particular, the apparatus may have some initial difficulty in acquiring a lock on the signal because the two VCOs may have output frequencies which are far away from the carrier frequency. Since the two VCO outputs are combined to form the output signal, which is then mixed down and fed back into the input, the feedback signal may be outside the working bandwidth of the circuit. Thus the circuit cannot function properly to pull the VCO back into the working frequency and cannot acquire a lock on the input signal.

According to a first aspect of the present invention there is provided apparatus for processing an input signal to generate an output signal, the processing arrangement comprising first and second feedback loops for generating, from said input signal, respective output signal components and ensuring that the components are correctly in phase for this purpose, each loop comprising a voltage controlled oscillator, having a frequency or phase which is variable in response to a control signal, for generating a loop output signal which forms one of the components of the output signal, or from which one such component is derived, and a comparator for generating the control signal, and combining means for combining the loop output signals to derive a signal representative of the output signal or signals representative of components of the output signal, and means for providing first and second feedback loop operating signals, dependent on the representative signal or representative signals and in phase quadrature with one another, for each loop, applying the feedback loop operating signal to one input of the comparator and another input of the comparator being coupled to receive a component of the input signal characterised in that signal-stability means for continuously ensuring that the output signal is stable whatever the phase of the output signal relative to the input signal.

The VCOs of sensitivity c may receive first and second control signals ($v_1$ and $v_2$) according to the equations $$v_1 = \frac{k\Delta\phi}{c} - \frac{k\Delta r}{c\sqrt{(4R^2 - r^2)}}$$

$$v_2 = \frac{k\Delta\phi}{c} + \frac{k\Delta r}{c\sqrt{4R^2 - r^2}}$$

where $\Delta\phi$ and $\Delta r$ are the phase and amplitude differences, respectively, between the input signal to be processed and the processed output signal, r is the amplitude of the input signal to be processed, R is the amplitude of the respective VCO output signals, and k is the gain of the feedback loop formed by feeding the processed output signal back to the detectors.

An advantage of the invention is that the system is stable and no switching of the input signals is necessary.

The means for providing feedback loop operating signals may include an oscillator having quadrature output signals, and first and second mixers, one for each loop, for generating the first and second feedback loop operating signals, the mixers both being coupled to receive the said representative signal as one input, and to receive respective quadrature output signals from the oscillator as another input.

The apparatus may also include an amplifier for each loop connected between the voltage controlled oscillator for that loop and a respective input of the combining means.

The input signal may be in the form of Cartesian components x and y and the signal-stability means and the comparators may derive control signals $v_1$ and $v_2$ for the respective VCOs:

$$v_1 = k\Delta x\left[\frac{-x}{cr\sqrt{4R^2-r_2}} - \frac{y}{cr^2}\right] + k\Delta y\left[\frac{x}{cr^2} - \frac{y}{cr\sqrt{4R^2-r_2}}\right]$$

$$v_2 = k\Delta x\left[\frac{x}{cr\sqrt{4R^2-r_2}} - \frac{y}{cr^2}\right] + k\Delta y\left[\frac{x}{cr^2} + \frac{y}{cr\sqrt{4R^2-r_2}}\right]$$

where k=the loop gain of the feedback loops, r=the amplitude of the input signal as represented by the components x and y, R=the amplitude of the output signals of the VCOs, Δx=the difference between the x component of the input signal and the corresponding Cartesian component of the processed output signal, and Δy=the difference between the y component of the input signal and the corresponding Cartesian component of the processed output signal.

The above equations are simplified versions of equations which provide the optimum driving signals for the VCOs.

In other embodiments of the invention the phase of a vector representing the input signal is, in effect, changed continuously to always occupy an optimum position for stability.

As an alternative, in some embodiments of the invention the input signal vector is so biassed that when the envelope of the input passes through zero, the envelope of the biassed signal does not. Such an arrangement not only reduces noise but also ensures stability.

According to a second aspect of the present invention there is provided apparatus for processing an input signal to provide a processed output signal, comprising a phase detector and an amplitude detector connected to receive an input signal to be processed and a feedback signal as inputs, first and second means for generating first and second component signals having frequencies or phases which are variable in response to first and second control signals, means for combining the first and second component signals in deriving the processed output signal, means for deriving a feedback signal from the processed output signal or components thereof, difference means for deriving the difference between the output signal of the phase detector and a corrected signal derived from the output signal of the amplitude detector to generate the first control signal, summing means for deriving the sum of the correction signal and the output signal of the phase detector to generate the second control signal, and correction means for deriving the correction signal from the input signal to be processed to reduce the dependence of the amplitude response of the apparatus on the amplitude of the input signal.

Methods equivalent to the first and second aspects of the invention and the apparatus claimed also form part of the invention, such as a method of processing a input signal to generate an output signal including the steps of using first and second feedback loops to generate, from said input signal, respective output signal components and ensuring that the components are correctly in phase for this purpose, for each loop, generating from a voltage controlled oscillator, having a frequency or phase which is variable in response to a control signal, a loop output signal which forms one of the components of the output signal, or from which one such component is derived, combining the loop output signals and the input signal to derive a signal representative of the output signal or signals representative of components of the output signal, generating feedback loop operating signals, in phase quadrature with one another, from the representative signal or representative signals, one for each loop, and for at least one loop, comparing the feedback loop operating signal with a component of the input signal to provide the respective control signal ensuring that the output signal is stable whatever the phase of the output signal relative to the input signal.

In order to avoid the disadvantages outlined above in respect of VCOs, the VCOs may be allowed to phase lock onto a voltage controlled crystal oscillator (VCXO). The frequency of the VCXO may be changed by a small fraction by applying a control voltage, and the output frequency is precise and more stable than a normal VCXO.

Embodiments of the invention will now be described by reference to the following drawings, in which.

Figure 3:
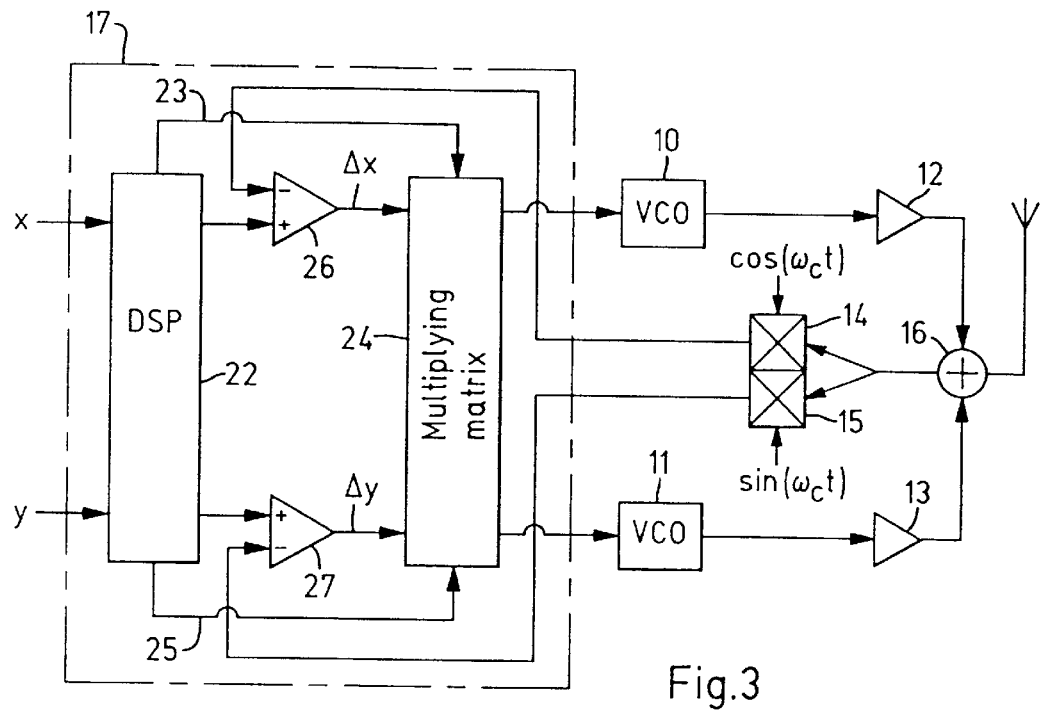
Figure 4:
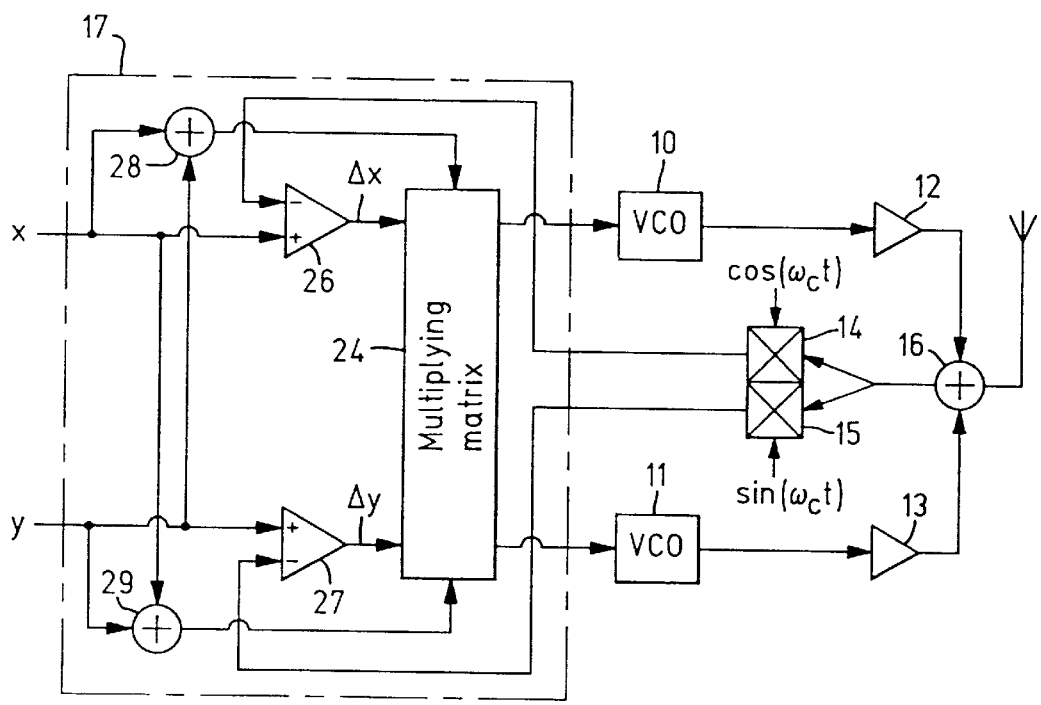
Figure 5:
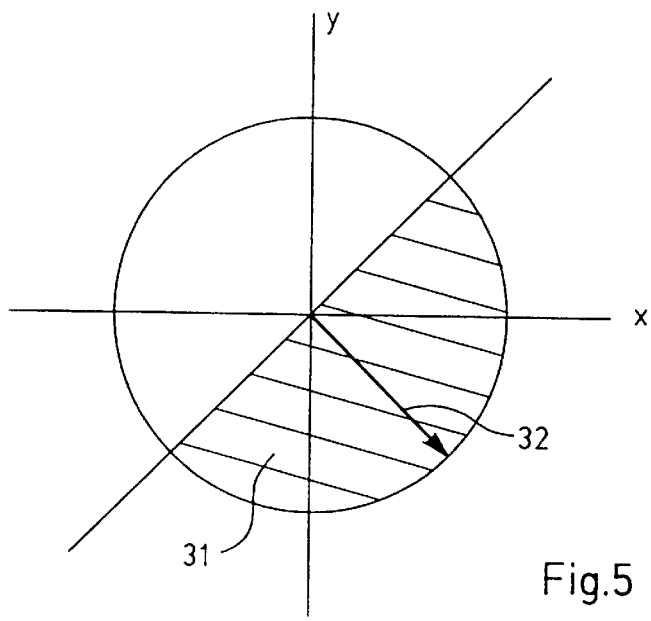
Figure 6:
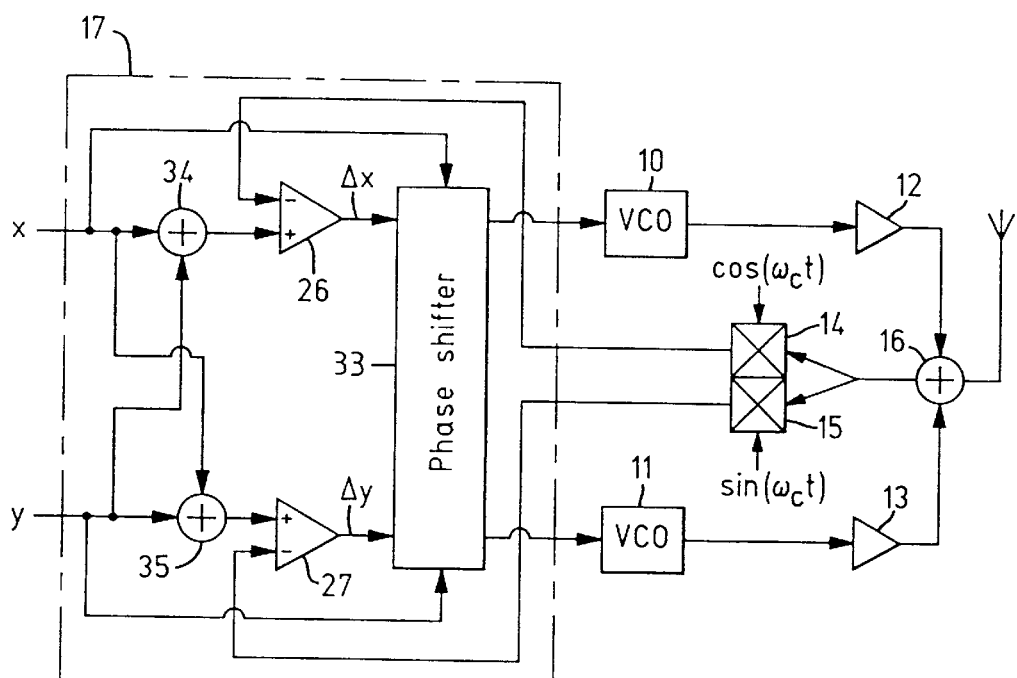
Figure 7:
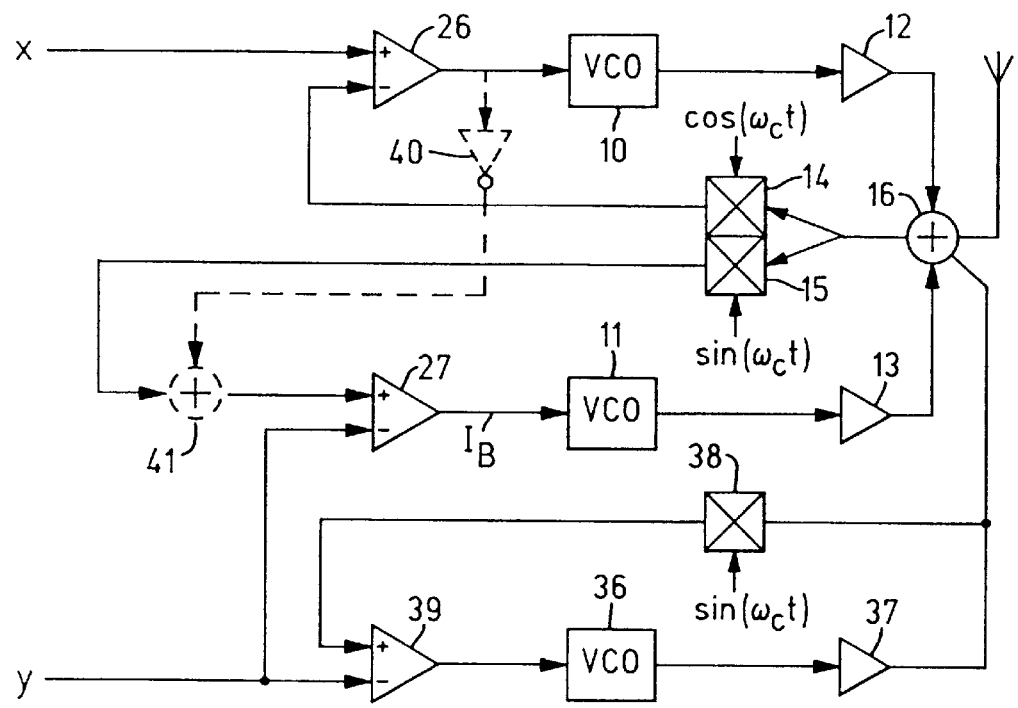
Figure 8:
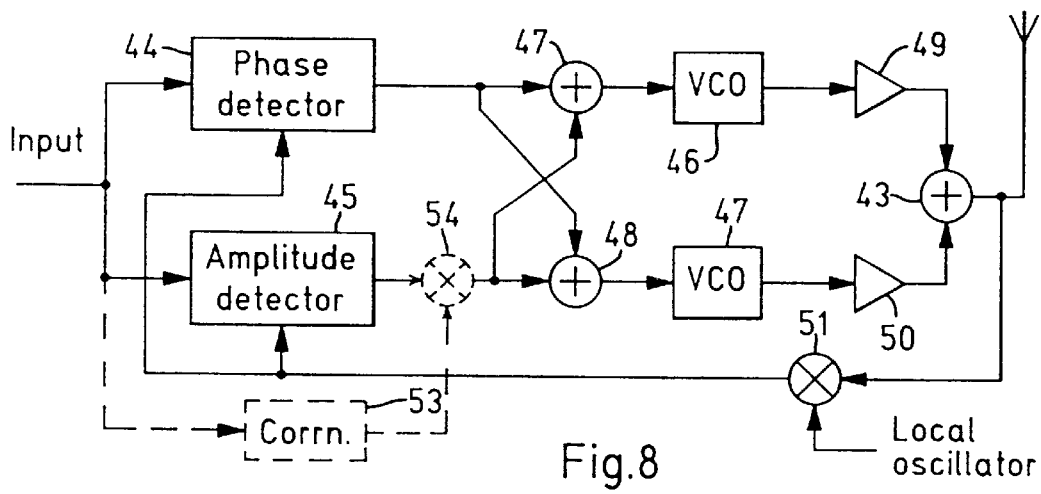
Figure 9:
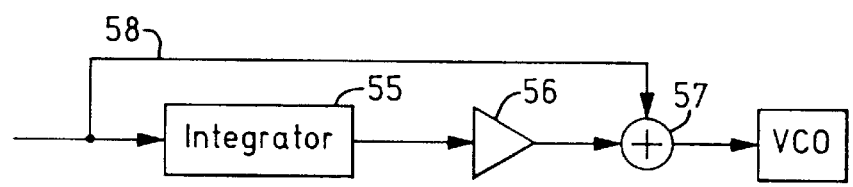
Figure 10:
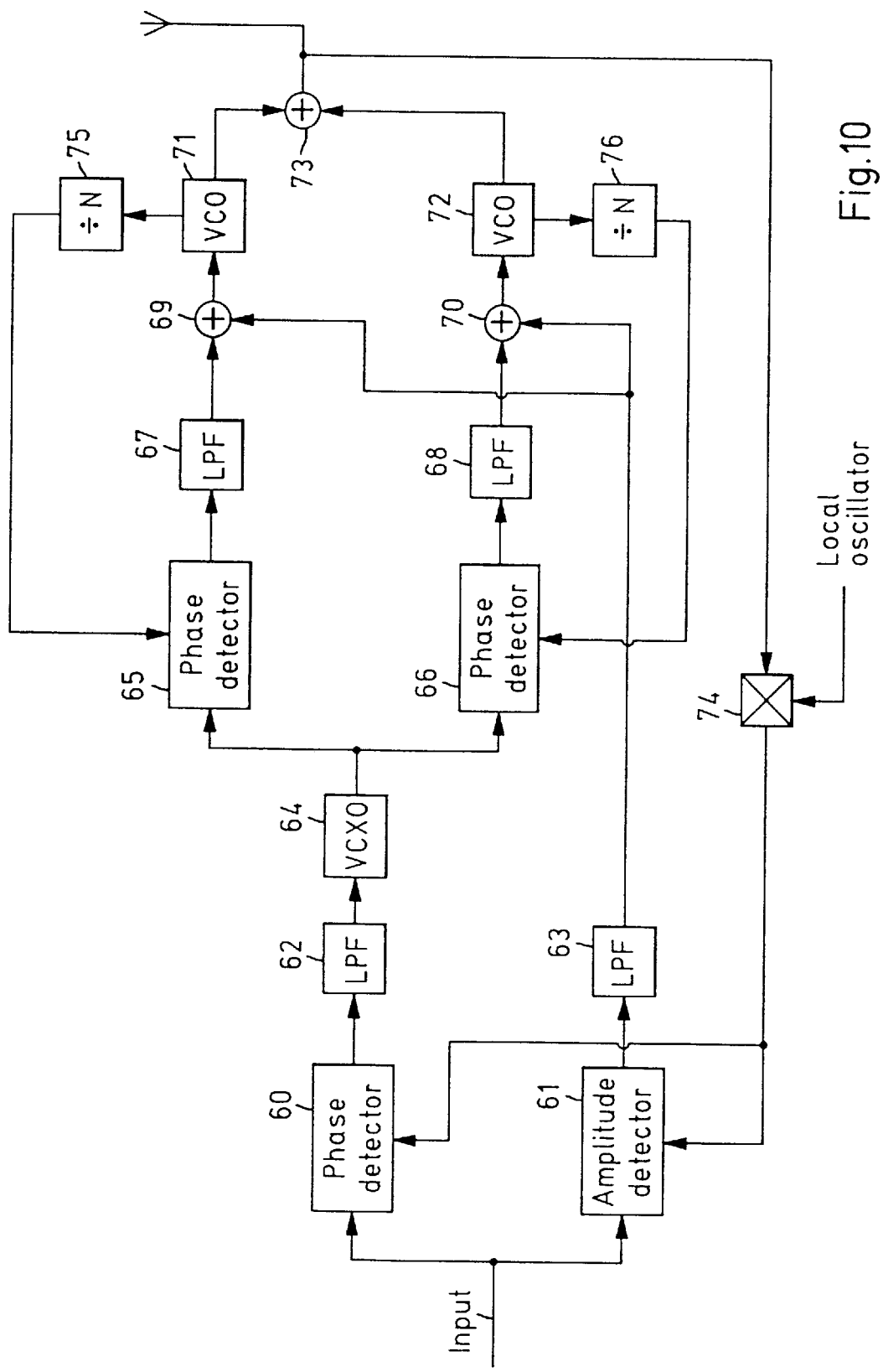

FIG. 3 is a block diagram of a modulator according to the invention in which control signals according to certain equations are derived from Cartesian components of an input signal, FIG. 4 is a simplified version of FIG. 3 in which the derivation of the control signals avoids the operation of division, FIG. 5 is a diagram showing the zone which an input vector must occupy for stable operation of the invention, FIG. 6 is a block diagram of a modulator according to the invention in which, in effect, the phase of the input signal is changed to always be optimum for stability, FIG. 7 is a diagram of a modulator according to the invention, in which the input signal is, in effect, biassed from a position where its envelope may go through zero to a position where it cannot do so, FIG. 8 is a diagram of a synthesizer according to the invention employing phase and amplitude detectors and, optionally, means for generating a correction signal, and FIG. 9 is a diagram used in explaining how first order modulators according to the invention may be implemented, and FIG. 10 is a diagram of another synthesizer according to the invention employing phase and amplitude detectors and, optionally, means for generating a correction signal.

Figure 1:
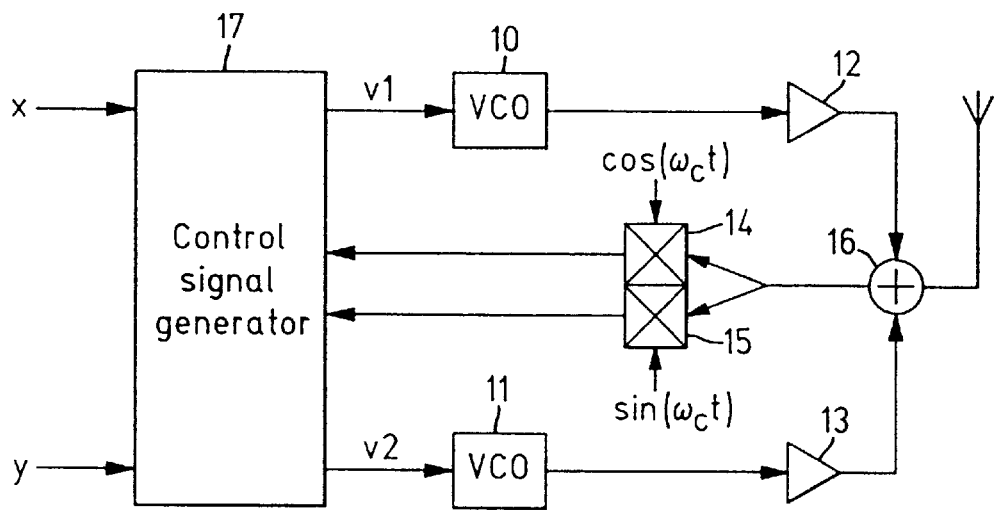
FIG. 1 is a block diagram of a modulator according to the invention.

FIG. 1 shows the basic structure of a modulator employing two feedback loops, each comprising a VCO 10,11, a non-linear radio-frequency amplifier 12,13 and a mixer 14,15, to synthesize an output signal at the output of a summing circuit 16. The input for the circuit is the Cartesian components I and Q, of a signal s(t) separated in a known way or already existing for example in a DSP, and applied as signals x and y to a control signal generator 17. The mixers 14 and 15 receive the output of the circuit 16 and respective quadrature demodulating signals $\cos \omega_c t$ and $\sin \omega_c t$, where $\omega_c$ is the difference in frequency between the signals x and y and the output signals of the VCOs. The output signals of the mixers 14 and 15 are applied to the generator 17.

Figure 2:
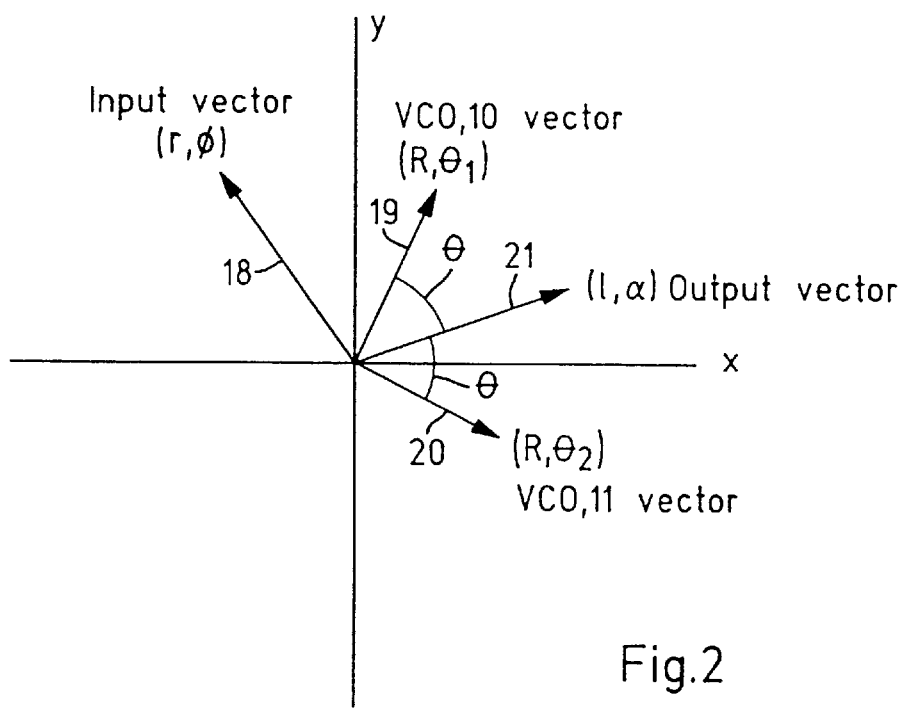
FIG. 2 is a diagram showing vectors relevant to the operation of FIG. 1.

A vector diagram showing signals relevant to FIG. 1 is shown in FIG. 2 where the signal s(t) is represented by a vector (18), r, ϕ, vectors 19 and 20 represent the output signals $R\theta_1$ and $R\theta_2$ of the VCOs 10 and 11, respectively, and a vector 21 represents the output signal l,α of the summing circuit 16. The vectors 19 and 20 are each separated by an angle θ from the vector 21.

It can be seen that, $$\alpha = \frac{\theta_1 + \theta_2}{2}$$

$$\theta = \frac{\theta_1 - \theta_2}{2}$$

$$\Delta\phi = \theta - \alpha$$

$$l = 2R\cos\theta$$

where α is the output signal phase from summing circuit 16, ϕ is the phase of the input signal r, ϕ, Δϕ is the phase difference between the input and output signals and l is the output signal amplitude.

It can be shown that in an ideal closed loop configuration of FIG. 1 where changes in the input signals x and y are compensated by changes in the output signals of the VCOs 10 and 11, the control signals $v_1$ and $v_2$ applied to these VCOs, respectively are given by $$v_1 = \frac{\omega}{c} = \frac{r'}{c\sqrt{4R^2 - r^2}} = \qquad \text{equation 1}$$

$$\frac{\delta x}{\delta t}\left[\frac{-x}{r\sqrt{4R^2 - r^2}} - \frac{y}{r^2}\right] + \frac{\delta y}{\delta t}\left[\frac{x}{r^2} - \frac{y}{r\sqrt{4R^2 - r^2}}\right]$$

$$v_2 = \frac{\omega}{c} = \frac{r'}{c\sqrt{4R^2 - r^2}} = \qquad \text{equation 2}$$

$$\frac{\delta x}{\delta t}\left[\frac{x}{r\sqrt{4R^2 - r^2}} - \frac{y}{r^2}\right] + \frac{\delta y}{\delta t}\left[\frac{x}{r^2} + \frac{y}{r\sqrt{4R^2 - r^2}}\right]$$

where c is the sensitivities of the VCOs 10 and 11, r' is $$\frac{\delta r}{\delta t} \text{ and } \omega \text{ is } \frac{\delta\phi}{\delta t}.$$

In order to realise a practical physical implementation of these equations some simple approximations may be made. For example, it can be assumed that δx/δt is proportional to δx, and δx can be approximated by Δx which is the difference between the x component of the input signal and the x component of the system output signal. The same approximation can be applied to δy/δt, ω and r'. The control process can then be described by, $$v_1 = \frac{k\Delta\phi}{c} - \frac{k\Delta r}{c\sqrt{4R^2 - r^2}} \qquad \text{equation 3}$$

$$= k\Delta x\left[\frac{-x}{cr\sqrt{4R^2 - r^2}} - \frac{y}{cr^2}\right] + k\Delta y\left[\frac{x}{cr^2} - \frac{y}{cr\sqrt{4R^2 - r^2}}\right] \qquad \text{equation 4}$$

$$v_2 = \frac{k\Delta\phi}{c} + \frac{k\Delta r}{c\sqrt{4R^2 - r^2}} \qquad \text{equation 5}$$

$$= k\Delta x\left[\frac{x}{cr\sqrt{4R^2 - r^2}} - \frac{y}{cr^2}\right] + k\Delta y\left[\frac{x}{cr^2} + \frac{y}{cr\sqrt{4R^2 - r^2}}\right] \qquad \text{eqaution 6}$$

where k is the loop gain of the system.

From these equations it is possible to devise two generic forms of control circuit implementation—one using Cartesian (IQ) feedback, the other using vector (phase and amplitude) feedback.

FIG. 3 shows a modulator which implements equations 4 and 6 and uses Cartesian feedback paths by way of the mixers 14 and 15. The control signal generator 17 comprises a DSP 22 which may either receive the signals x and y or these signals may already be present in the DSP as part of other signal processing. The DSP generates signals a1, a2, a3 and a4 where $$a1 = \frac{-x}{r\sqrt{4R^2 - r^2}} - \frac{y}{r^2}$$

$$a2 = \frac{x}{r^2} - \frac{y}{r\sqrt{4R^2 - r^2}}$$

$$a3 = \frac{x}{r\sqrt{4R^2 - r^2}} - \frac{y}{r^2}$$

$$a4 = \frac{x}{r^2} + \frac{y}{r\sqrt{4R^2 - r^2}}$$

The signals a1, a2, a3 and a4 are applied by way of connections 23 and 25 to a multiplying matrix 24 comprising four multipliers. Two comparators 26 and 27 form Δx and Δy from the signals x and y (sent by way of the DSP 22) and the outputs of the mixers 14 and 15. The output signal amplitude R of the VCOs 10 and 11 is known, and thus the matrix 24 is able to generate the control signals $v_1$ and $v_2$ for the VCOs. The matrix 24 may be constructed from commercially available analogue multipliers when digital-to-analogue converters (not shown) are positioned at the outputs of the DSP 22 or the matrix 24 may be formed by multiplying digital-to-analogue converters at the DSP outputs.

For an input signal phase of ϕ and an output signal phase of a, the stable locked condition occurs when α equals ϕ, and all the derivatives of α at α=ϕ are zero. Using these stability criterion, it can be seen that the modulator of FIG. 3 is stable for any input signal phase without the use of the switching arrangements described in the above mentioned application WO 93/23921-A.

The division process implicit in equations 4 and 6 can be avoided by simplification to the following equations:

$$v_1 = \frac{k}{c}\Delta x[-x - y] + \frac{k}{c}\Delta y[x - y] \qquad \text{equation 7}$$

$$v_2 = \frac{k}{c}\Delta x[x - y] + \frac{k}{c}\Delta y[x + y] \qquad \text{equation 8}$$

Equations 7 and 8 can be implemented using the arrangement of FIG. 4 where a summing junction 28 and a summing junction 29, arranged to subtract, generate the following signals x+y and x−y for the multiplying matrix 24.

A simplified version can be derived from equations 7 and 8 by hard-limiting the terms (x−y) and (x+y).

$$v_1 = -\frac{k}{c}\Delta x \, \text{Sgn}[x+y] + \frac{k}{c}\Delta y \, \text{Sgn}[x-y]$$

$$v_2 = \frac{k}{c}\Delta x \, \text{Sgn}[x-y] + \frac{k}{c}\Delta y \, \text{Sgn}[x+y]$$

$$\text{where } \text{Sgn}[a] = \begin{cases} -1, & a < 0 \\ 1, & a \geq 0 \end{cases}$$

After scaling and rotating the system by 45°

$$v_1 = -\frac{k}{c}\Delta x\{\text{Sgn}[x] + \text{Sgn}[-y]\} + \frac{k}{c}\Delta y\{\text{Sgn}[-y] - \text{Sgn}[x]\} \quad \text{equation 9}$$

$$v_2 = -\frac{k}{c}\Delta x\{\text{Sgn}[-y] - \text{Sgn}[x]\} + \frac{k}{c}\Delta y\{\text{Sgn}[-y] + \text{Sgn}[x]\} \quad \text{equation 10}$$

As is known from the above mentioned application WO 93/23921-A, the phase locked loops embodying the VCOs are stable only when input signals are in a certain phase range. As a result some two-feedback loop arrangements are only stable when the input vector r, φ is in the semicircular shaded region 31 of FIG. 5. The switching arrangements are provided to ensure that the Cartesian components of the input vector are shifted so that this vector is translated to the stable region 31. It can be shown that the optimum phase position of this vector is −45°+2πn, where n is an integer as shown at 32.

In the said above mentioned application, the input signal is restricted by four quadrature switching to one quadrant (the 4th quadrant). From equations 9 and 10 the control signals become:

$$v_1 = -\frac{k}{c}\Delta x$$

$$v_2 = \frac{k}{c}\Delta y$$

The synthesizer of FIG. 6 includes summing circuits 34 and 35, and a phase shifter 33 to shift the phases of the input signals for the VCOs 10 and 11 as though the vector r, φ were continuously held in the optimum position shown at 32, as the input vector varies in phase. As a result the output vector 1, α always lags 45° behind the input vector r, φ in the steady state.

The phase shifter 33 ensures that whatever the phase of the input vector, the input signals for the VCOs represent the input vector shifted to the fourth quadrant (bottom right in FIG. 5) but the shifted vector tends to settle on either the x or y axis not the position 32. By adding the x and y signals in the summing circuit 34 and subtracting them in the summing circuit 35, the input signals for the comparators 26 and 27 represent an input signal shifted by 45° to the optimum position 32.

If the input signal is considered to be $re^{j\beta}$, where β is its phase angle, then the phase shifter 33 performs the following complex multiplication $$v_1 + jv_2 = \frac{(\Delta x + j\Delta y)(x - jy)}{\sqrt{x^2 + y^2}}$$

The real part of this equation is the control signal for the VCO 10 and the imaginary part is the control signal for the VCO 11. The denominator normalises the control signals.

Most versions of the modulator of FIG. 1, using either Cartesian or Vector feedback, cannot respond fast enough when the envelope of the vector r, φ crosses zero. The control signal generator cannot respond sufficiently fast to prevent the input and output vectors being out of lock and noise being generated as a consequence. An arrangement which overcomes this problem is shown in FIG. 7 where an extra VCO 36 and non-linear amplifier 37 provide an additional input for the summing circuit 16. The output of the amplifier 37 is demodulated using a sin $\omega_c$ signal in a mixer 38 with output connected to the inverting input of a comparator 39 which receives they signal at its non-inverting input.

Since the VCO 36 receives the difference between the y signal and its own Q output component after amplification, its output is nearly equal to the Q component of the output signal, plus a time varying portion of the I component. The control signals for the VCOs 10 and 11 are based on the resultant output signal from the summing circuit 16, and thus the output signals of these VCOs compensate for the output signal of the VCO 36 at that sunning circuit. Hence the combined output of the VCOs 10 and 11 is biased to oppose the I component from the VCO 36, which has the effect that when the input signal envelope crosses zero the operating point of the VCO 10 is shifted from zero and so the zero crossing does not affect the control circuit and noise is not generated. Incidentally since most of the Q component is provided by the VCO 36, the VCOs 10 and 11 only provide a small correcting Q component. Since the loops containing the VCOs 10 and 11 function in the normal way the bias, together with any I and Q error at the output is removed at the output as in previous examples. By adding the VCO 36, the inputs to the other VCOs (10 and 11) are mapped to a new position on the vector diagram as follows $$x \to x + \sqrt{R^2 - y^2}$$

$$y \to 0$$

Thus the input signal is mapped to the stable region 31 of FIG. 5 and no switching or phase shifting (for example in a multiplying matrix) is required.

The operation of the circuit is substantially the same when an optional inverting amplifier 40 with gain equal to 0.5 and an addition circuit 41 are added as shown in dashed lines.

A vector locked loop (VLL) system based on equations 3 and 5 is now described and shown in FIG. 8. The phases and amplitudes of an input signal s(t) and a modulated output signal present at the output of a summing circuit 43 are compared in phase and amplitude detector circuits 44 and 45. VCOs 46 and 47 receive input signals from the detectors 44 and 45 by way of a summing circuit 47, arranged to subtract, and a summing circuit 48. Non-linear amplifiers 49 and 50 provide amplified output signals from the VCOs 46 and 47 as input signals to the summing circuit 43. The output signal of this summing circuit is demodulated using a mixer 51 supplied with a local oscillator signal at a frequency equal to the difference between the output signal frequency of the VCOs 46 and 47 and the frequency of the input signal s(t), and the mixer output is fed back to the detectors 44 and 45.

The signals $v_1$ and $v_2$ applied at the inputs to the VCOs 46 and 47 are given by:

$$\frac{v_1}{c} = \theta'_1 = k\Delta\phi - k\Delta l$$

-continued $$\frac{v_2}{c} = \theta'_2 = k\Delta\phi + k\Delta l$$

where $\Delta\phi$ is the phase difference between the input signal phase and output signal phase and $\Delta l$ is the magnitude difference.

The phase response of the feedback loops of FIG. 8 is independent of the input signal but the amplitude is a positive function of the input amplitude which increases with input amplitude. To improve performance a correction-signal generator 53 and a multiplying circuit 54 can be added as shown in dashed lines.

The signal generated by the correction-signal generator 53 equals $$\frac{1}{\sqrt{4R^2 - r^2}},$$

and when used as a multiplier for the $\Delta r$ signal in the multiplier 54, the VCO input signals conform to equations 3 and 5.

Some other functions which have a positive relationship with the input signal amplitude r can also be used as the correction signal. For example the signal generated by the correction-signal generator may equal $$0.045r + \frac{R}{2}$$

The correction signal generator may for example comprise a commercially available anti-log, circuit or be implemented as part of a DSP program, in a DSP which may form part of an overall system including FIG. 8.

The tracking performance of the modulators of FIGS. 3, 4 and 6 to 8 and other modulators or synthesizers using VCOs or equivalent based on FIG. 1, can be improved by adding a loop filter known from VCO theory, at the input to each VCO, thus providing first order modulators or synthesizers. A suitable filter is shown in FIG. 9 and comprises an integrator 55, a linear amplifier 56 having a gain of k' (a constant value not dk/dt) and summing circuit 57 adding the usual VCO input applied by way of a path 58 to the output of the amplifier 56. The output of the circuit 57 may be applied as the control signal for each of the VCOs in any of the modulators described, for example one circuit of FIG. 9 may be connected between each output of the generator 17 and the respective VCOs 10 and 11 to replace the connections shown in FIG. 3. A significant 15 dB improvement in intermodulation suppression has been achieved over a zero order VLL modulator of the type shown in FIG. 8 by converting the first order.

An alternative to the vector locked loop system of FIG. 8 is shown in FIG. 10. In this embodiment the two VCOs, 71 and 72, are synchronised, driven by the amplitude detector 61. In a system where the VCOs function independently, (such as FIG. 8) the centre frequencies of the VCOs may drift so far apart as to prevent the system from locking. Therefore the VCOs 71 and 72 may be allowed to phase lock onto a voltage controlled crystal oscillator reference (VCXO 64) using phase locked loops. When functioning, the phase output of the two VCOs 71 and 72 will be the same as the output of the reference VCXO 64. These two phase outputs are combined by the combiner 73 to give the system output. The output signal of this combining circuit is demodulated using a mixer 74 supplied with a local oscillator signal at a frequency equal to the difference between the output signal frequency and the frequency of the input signal s(t), and the mixer output is fed back to the detectors 60 and 61. The output of the amplitude detector 61 is used to drive the VCOs in opposite directions, modifying the relative phase of the two VCO outputs, thus changing the amplitude of the output envelope. The output frequency of the two VCOs 71 and 72 will always be N times the reference signal, where N is the division ratio of the two phase locked loops. The components 75 and 76 which produce this modification of the reference signal may be programmable dividers.

It will be realised that the invention can be put into operation in many other ways than those specifically described. For example the VCOs may be any frequency generator having an output signal which can be controlled using a control signal, for example some forms of unstable amplifier or direct digital synthesizers. Other forms of loop filters may be used for first order systems and the control signal generator 17 may be completely or partially implemented in hardware, or computer programs such as a programmed DSP, provided conversion of the DSP output signals to analogue is provided.

As described in the above mentioned application WO 93/23921-A the modulators described may be reconfigured as demodulators, or as amplifiers without frequency translation, when the multipliers 14 and 15 are omitted, or the modulators may provide frequency translation without the use of a carrier wave.

We claim:

1. Apparatus for processing an input signal to generate a combined signal, said apparatus comprising first and second feedback loop units for generating, from said input signal, first and second loop output signals, respectively, and ensuring that the loop output signals have a phase relation corresponding to one among a set of predetermined phase relations, said first feedback loop unit comprising a first voltage controlled oscillator, having one of a frequency and a phase which is variable in response to a signal $v_1$, for generating a first oscillator signal, said first loop output signal being based at least in part on the first oscillator signal, and a first comparator for generating a first control signal, the signal $v_1$ being based at least in part on the first control signal, said second feedback loop unit comprising a second voltage controlled oscillator, having one of a frequency and a phase which is variable in response to a signal $v_2$, for generating a second oscillator signal, said second loop output signal being based at least in part on the second oscillator signal, and a second comparator for generating a second control signal, the signal $v_2$ being based at least in part on the second control signal, and combining means for combining the loop output signals and outputting a combined signal, and means for providing first and second feedback loop operating signals, based at least in part on the combined signal and in phase quadrature with one another, and for each loop, applying the feedback loop operating signal to one input of the comparator another input of the comparator being coupled to receive a corresponding one of a first loop input signal and a second loop input signal, and signal-stability means for continuously stabilizing the combined signal by ensuring that the combined signal is stable whatever the phase of the combined signal relative to the input signal, said signal-stability means receiving the input signal and outputting the first and second loop input signals.

2. Apparatus according to claim 1 wherein the means for providing the feedback loop operating signals includes
   an oscillator having quadrature output signals, and
   first and second mixers, one for each loop, for generating the first and second feedback loop operating signals, the mixers both being coupled to receive the combined signal as one input, and to receive respective quadrature output signals from the oscillator as another input.

3. Apparatus according to claim 1 including an amplifier for each loop connected between the voltage controlled oscillator and a respective input of the combining means.

4. Apparatus according to claim 2 wherein
   the input signal has Cartesian component signals x and y, and
   the signal-stability means comprises means for providing an additional signal for the combining means which has the effect of so biassing the input signal that when the envelope of the unbiassed signal passes through zero the envelope of the biassed signal, as represented by the loop input signals, does not, and
   the signal-stability means includes a signal-stability loop comprising a signal-stability comparator, signal-stability means for generating a loop output signal having a frequency or phase which is variable in response to a control signal, a signal-stability amplifier connected at the output of the signal-stability means for generating a loop output signal and a signal-stability multiplier for demodulating the amplifier output signal using a signal in phase with one of the quadrature output signals to provide one input to the signal-stability comparator, the other input to the signal-stability comparator being one of the x and y signals.

5. Apparatus according to claim 4 including
   means for adding a proportion of the output of one of the first and second comparators to the feedback signal applied to the other of the first and second comparators.

6. Apparatus according to claim 2 including an amplifier for each loop connected between the voltage controlled oscillator and a respective input of the combining means.

7. Apparatus according to claim 6 wherein the signal-stability means comprises means for providing an additional signal for the combining means which has the effect of so biassing the input signal that when the envelope of the unbiassed signal passes through zero the envelope of the biassed signal, as represented by the loop input signals, does not, and
   the input signal has Cartesian component signals x and y, and
   the signal-stability means includes a signal-stability loop comprising a signal-stability comparator, signal-stability means for generating a loop output signal having a frequency or phase which is variable in response to a control signal, a signal-stability amplifier connected at the output of the signal-stability means for generating a loop output signal and a signal-stability multiplier for demodulating the amplifier output signal using a signal in phase with one of the quadrature output signals to provide one input to the signal-stability comparator, the other input to the signal-stability comparator being one of the x and y signals.

8. An apparatus according to claim 7 including means for adding a proportion of the output of one of the first and second comparators to the feedback signal applied to the other of the first and second comparators.

9. Apparatus according to claim 1, claim 2, claim 3, or claim 6, wherein the input signal has Cartesian components x and y, and, in each loop the signal-stability means and the comparators derive control signals $v_1$ and $v_2$ for the respective VCOs:

$$v_1 = k\Delta x\left[\frac{-x}{cr\sqrt{4R^2-r^2}} - \frac{y}{cr^2}\right] + k\Delta y\left[\frac{x}{cr^2} - \frac{y}{cr\sqrt{4R^2-r^2}}\right],$$

$$v_2 = k\Delta x\left[\frac{x}{cr\sqrt{4R^2-r^2}} - \frac{y}{cr^2}\right] + k\Delta y\left[\frac{x}{cr^2} + \frac{y}{cr\sqrt{4R^2-r^2}}\right],$$

where
   k=the loop gain of first and second feedback loops, each of said feedback loops including a respective one of the feedback loop units,
   r=the amplitude of the input signal as represented by the components x and y,
   R=the amplitude of the output of the VCOs,
   $\Delta x$=the difference between the x component of the input signal and the corresponding Cartesian component of the combined signal, and
   $\Delta y$=the difference between the y component of the input signal and the corresponding Cartesian component of the combined signal.

10. Apparatus according to claim 9 wherein
   the comparators are connected to derive $\Delta x$ and $\Delta y$, and
   the signal-stability means comprises
   a signal-processor means connected to receive the components of the input signal and to generate the following signals:

$$a1 = \frac{-x}{cr\sqrt{4R^2-r^2}} - \frac{y}{cr^2}$$

$$a2 = \frac{x}{cr^2} - \frac{y}{cr\sqrt{4R^2-r^2}}$$

$$a3 = \frac{x}{cr\sqrt{4R^2-r^2}} - \frac{y}{cr^2}$$

$$a4 = \frac{x}{cr^2} + \frac{y}{cr\sqrt{4R^2-r^2}}$$

and,
   multiplier means connected to receive the signals $\alpha 1$, $\alpha 2$, $\alpha 3$, $\alpha 4$, $\Delta x$ and $\Delta y$ and to generate the control signals $v_1$ and $v_2$ therefrom.

11. An apparatus according to claim 10 including a respective integration and addition circuit for receiving as a loop signal a respective one among the signals $v_1$ and $v_2$ and adding the integral of the loop signal to the loop signal.

12. Apparatus according to claim 9 wherein
   the input signal has Cartesian component signals x and y, and
   the signal-stability means comprises
   addition means for adding the x and y signals,
   difference means for deriving the difference between the x and y signals, and
   a signal processor means connected to receive the x and y components of the input signal and the output signals of the comparators, and to derive the signals $v_1$ and $v_2$, and wherein the comparators are connected to receive the outputs of the addition means and the difference means as the loop input signals.

13. An apparatus according to claim 12 including a respective integration and addition circuit for receiving as a loop signal a respective one among the signals $v_1$ and $v_2$ and adding the integral of the loop signal to the loop signal.

14. An apparatus according to claim 9 including a respective integration and addition circuit for receiving as a loop signal a respective one among the signals $v_1$ and $v_2$ and adding the integral of the loop signal to the loop signal.

15. Apparatus according to claim 1, claim 2, claim 3, or claim 6, wherein the input signal has Cartesian component signals x and y, and the comparators are connected to derive Δx and Δy where Δx=the difference between the x component of the input signal and the corresponding Cartesian component of the combined signal, and Δy=the difference between the y component of the input signal and the corresponding Cartesian component of the combined signal, and the signal-stability means comprises addition means for adding the x and y signals, difference means for deriving the difference between the x and y components of the input signal, and signal processor means connected to receive the outputs of the comparators, the addition means and the difference means, and to derive the signals $v_1$ and $v_2$.

16. An apparatus according to claim 15 including a respective integration and addition circuit for receiving as a loop signal a respective one among the signals $v_1$ and $v_2$ and adding the integral of the loop signal to the loop signal.

17. Apparatus according to claim 1, claim 2, claim 3, or claim 6, wherein the signal-stability means comprises means for providing an additional signal for the combining means which has the effect of so biassing the input signal that when the envelope of the unbiassed signal passes through zero the envelope of the biassed signal, as represented by the loop input signals, does not.

18. An apparatus according to claim 17 including a respective integration and addition circuit for receiving as a loop signal a respective one among the signals $v_1$ and $v_2$ and adding the integral of the loop signal to the loop signal.

19. Apparatus according to claim 1, claim 2, claim 3, claim 4, claim 5, claim 6, claim 7, or claim 8, including a respective integration and addition circuit for receiving as a loop signal a respective one among the signals $v_1$ and $v_2$ and adding the integral of the loop signal to the loop signal.

20. Apparatus for processing an input signal to provide a combined signal, said apparatus comprising a phase detector and an amplitude detector connected to receive the input signal and a feedback signal as inputs, first and second means for generating first and second component signals having frequencies or phases which are variable in response to signals $v_1$ and $v_2$, means for combining the first and second component signals in deriving the combined signal, means for deriving the feedback signal from the combined signal or components thereof, difference means for deriving the difference between the output signal of the phase detector and a correction signal derived from the output signal of the amplitude detector to generate the signal $v_1$, summing means for deriving the sum of the correction signal and the output signal of the phase detector to generate the signal $v_2$, and correction means for deriving the correction signal from the input signal to reduce the dependence of the amplitude response of the apparatus on the amplitude of the input signal.

21. Apparatus according to claim 20 including mixer means for frequency translating the combined signal or components thereof in providing the feedback signal by an amount equal to the difference in frequency between the outputs of the said first and second means, and the input signal.

22. Apparatus according to claim 20 or 21 wherein the first and second means are VCOs of sensitivity c and receive signals $v_1$ and $v_2$ according to the equations $$v_1 = \frac{k\Delta\phi}{c} - \frac{k\Delta r}{c\sqrt{4R^2 - r^2}},$$

$$v_2 = \frac{k\Delta\phi}{c} - \frac{k\Delta r}{c\sqrt{4R^2 - r^2}},$$

where Δφ and Δr are the phase and amplitude differences, respectively, between the input signal and the combined signal, r is the amplitude of the input signal, R is the amplitude of the respective VCO output signals, and k is the gain of the feedback loop formed by feeding the combined signal back to the detectors.

23. An apparatus according to claim 22 including a respective integration and addition circuit for receiving as a loop signal a respective one among the signals $v_1$ and $v_2$ and adding the integral of the loop signal to the loop signal.

24. Apparatus according to claim 20 or 21 wherein the first and second means are VCOs of sensitivity c and receive signals $v_1$ and $v_2$ according to the equations $$v_1 = \frac{k\Delta\phi}{c} - \frac{k\Delta r}{c}\left(0.045r + \frac{R}{2}\right),$$

$$v_2 = \frac{k\Delta\phi}{c} + \frac{k\Delta r}{c}\left(0.045r + \frac{R}{2}\right),$$

where Δφ and Δr are the phase and amplitude differences, respectively, between the input signal and the combined signal, r is the amplitude of the input signal, R is the amplitude of the respective VCO output signals, and k is the gain of the feedback loop formed by feeding the combined signal back to the detectors.

25. An apparatus according to claim 24 including a respective integration and addition circuit for receiving as a loop signal a respective one among the signals $v_1$ and $v_2$ and adding the integral of the loop signal to the loop signal.

26. A method of processing an input signal to generate a combined signal including the steps of using first and second feedback loops to generate, from said input signal, first and second loop output signals, respectively, and ensuring that the loop output signals have a phase relation corresponding to one among a set of predetermined phase relations, for each loop, generating from a voltage controlled oscillator, having one of a frequency and a phase which is variable in response to a control signal, a respective one among the loop output signals, combining the loop output signals and the input signal to derive a combined signal, generating feedback loop operating signals, in phase quadrature with one another, from the combined signal, one for each loop, and for at least one loop, comparing the feedback loop operating signal with a component of the input signal to provide the respective control signal and continuously ensure that the combined signal is stable whatever the phase of the combined signal relative to the input signal.

27. A method of processing an input signal to provide a combined signal, comprising generating first and second component signals each having one of a frequency and a phase which is variable in response to a respective one among first and second control signals, combining the first and second component signals to derive the combined signal, deriving a feedback signal from the combined signal or components thereof, deriving the difference between the output signal of a phase detector and a correction signal derived from the output signal of a amplitude detector to generate the first control signal, summing the correction signal and the output signal of the phase detector to generate the second control signal, and deriving the correction signal from the input signal to reduce the dependence of the amplitude response of the apparatus on the amplitude of the input signal.

28. Apparatus for processing an input signal, said apparatus comprising:

(a) a first feedback loop unit for receiving a first loop input signal and generating a first loop output signal, said first feedback loop unit comprising (a1) a first comparator for receiving a first loop feedback signal and the first loop input signal and generating a first control signal; and (a2) a first oscillator for generating a first oscillator signal, said first oscillator having a frequency or phase which is variable in response to a signal $v_1$, the signal $v_1$ being based at least in part on the first control signal;

(b) a second feedback loop unit for receiving a second loop input signal and generating a second loop output signal, said second feedback loop unit comprising (b1) a second comparator for receiving a second loop feedback signal and the second loop input signal and generating a second control signal; and (b2) a second oscillator for generating a second oscillator signal, said second oscillator having a frequency or phase which is variable in response to a signal $v_2$, the signal $v_2$ being based at least in part on the second control signal;

(c) a signal combiner for receiving a first loop output signal and a second loop output signal, the first loop output signal being based at least in part on the first oscillator signal and the second loop output signal being based at least in part on the second oscillator signal, and outputting a combined signal;

(d) means for providing first and second loop operating signals, the first and second loop operating signals being in phase quadrature with one another and each being based at least in part on the combined signal; and (e) signal-stability means for receiving the input signal and outputting the first and second loop input signals, wherein the first loop feedback signal is based at least in part on the first loop operating signal, and the second loop feedback signal is based at least in part on the second loop operating signal, and wherein said first and second loop output signals have a phase relation corresponding to one among a set of predetermined phase relations, and wherein said signal-stability means maintains a continuous stability of the combined signal regardless of the relation between the phase of the combined signal and the phase of the input signal.

29. An apparatus for processing an input signal, said apparatus comprising:

a phase detector for receiving the input signal and a feedback signal and outputting a phase signal;

an amplitude detector for receiving the input signal and the feedback signal and outputting an amplitude signal;

a first signal generator for generating a first component signal having a frequency or phase which is variable in response to a signal $v_1$;

a second signal generator for generating a second component signal having a frequency or phase which is variable in response to a signal $v_2$;

a signal combiner for combining the first and second component signals and outputting a combined signal;

a feedback circuit for receiving at least a portion of the combined signal and outputting the feedback signal;

a subtractor for outputting a difference of the phase signal and a correction signal to generate the signal $v_1$;

an adder for outputting a sum of the phase signal and the correction signal to generate the signal $v_2$; and a correction signal generator for receiving the amplitude signal and outputting the correction signal, wherein the correction signal causes a dependence of the amplitude response of the apparatus on the amplitude of the input signal to be reduced.

30. A method of processing a input signal, including:

using first and second feedback loops to generate first and second loop output signals, respectively, from said input signal, said first and second output loop signals being substantially phase-matched with respect to each other, for each loop, generating a corresponding one of the first and second loop output signals from a voltage controlled oscillator, said voltage controlled oscillator having a frequency or phase which is variable in response to a corresponding one among first and second control signals, combining the loop output signals and the input signal to derive a combined signal, for each loop, generating a feedback loop operating signal from a corresponding one of the loop operating signals, the feedback loop operating signals being in phase quadrature with one another, and comparing one among the feedback loop operating signals with a component of the input signal to provide the first control signal, wherein the continuous stability of the combined signal is maintained regardless of the relation of the phase of the output signal to the phase of the input signal.

31. A method of processing an input signal, said method comprising:

generating a first component signal having a frequency or phase which is variable in response to a first control signal, generating a second component signal having a frequency or phase which is variable in response to a second control signal, combining the first and second component signals to derive a combined signal, deriving a feedback signal from a signal based at least in part on the combined signal, deriving the difference of an output signal of a phase detector and a correction signal to generate the first control signal, said phase detector receiving the input signal and the feedback signal, summing the correction signal and the output signal of the phase detector to generate the second control signal, and deriving the correction signal from an amplitude detector, said amplitude detector receiving the input signal and the feedback signal, said correction signal causing a dependence of the amplitude response of the apparatus on the amplitude of the input signal to be reduced.

* * * * *